United States Patent [19]

Twerdochlib

[11] Patent Number: 5,126,658
[45] Date of Patent: Jun. 30, 1992

[54] GENERATOR ROTOR WINDING GROUND DETECTION

[75] Inventor: Michael Twerdochlib, Oviedo, Fla.

[73] Assignee: Westinghouse Electric Corp., Pittsburgh, Pa.

[21] Appl. No.: 643,623

[22] Filed: Jan. 22, 1991

[51] Int. Cl.⁵ .......................................... G01R 31/02
[52] U.S. Cl. ............................. 324/158 MG; 324/545
[58] Field of Search ............... 324/158 MG, 545, 546, 324/509, 510, 511; 340/648, 650; 322/99; 361/20, 23, 42

[56] References Cited

U.S. PATENT DOCUMENTS

| | | | |
|---|---|---|---|
| 3,286,129 | 11/1966 | Gagniere | 324/545 |
| 3,727,123 | 4/1973 | Smith | 324/158 MG |
| 3,887,867 | 6/1975 | Safer et al. | 324/546 |
| 4,136,312 | 1/1979 | Salon et al. | 324/158 MG |
| 4,145,653 | 3/1979 | Voigt | 324/158 MG |
| 4,147,982 | 4/1979 | Emery | 324/545 |
| 4,187,525 | 2/1980 | Nagura et al. | 324/546 |
| 4,224,652 | 9/1980 | Fiorentzis | 324/545 |
| 4,556,946 | 12/1985 | Taniguti | 324/510 |
| 4,605,925 | 8/1986 | Mark | 340/648 |
| 4,812,751 | 3/1989 | Roberts et al. | 324/546 |
| 4,864,242 | 9/1989 | Hurley | 324/546 |

Primary Examiner—Ernest F. Karlsen

[57] ABSTRACT

A device for detecting a ground fault in a winding mounted to rotate with the rotor of a machine, in which an electric potential is present across the winding during machine operation, the rotor is grounded and the winding is normally insulated from ground, the device including: a current responsive light emitting element mounted to rotate with the rotor and electrically connected between the winding and the rotor; and a light responsive detector fixed in a position relative to the machine and having a field of view which is traversed by the light emitting element during a portion of each revolution of the rotor.

12 Claims, 2 Drawing Sheets

GENERATOR ROTOR WINDING GROUND DETECTION

BACKGROUND OF THE INVENTION

The present invention relates to the detection of a ground fault in the rotor winding of a rotating machine in order to produce a warning in time to prevent damage to the machine.

In large rotating machines, the rotor winding, which is isolated from ground, is supplied with a direct current from an exciter. The rotor winding is carried by a rotor body which is itself grounded and the winding is enclosed by insulation which electrically isolates it from the rotor body. Eventually, the resistance of the winding insulation to ground will decrease to an extent which produces a low resistance path between the rotor winding and ground.

Since the rotor winding is electrically floating, the occurrence of a ground condition at one point of the rotor winding will not, by itself, result in damage since there is no return path for current flowing to ground. However, if a second such defect should appear, current will be shunted from a portion of the rotor winding to the rotor body and if this current is of sufficient magnitude, it can result in arcing and localized heating which can severely damage the rotor structure.

For the above reasons, large rotating machines are typically equipped with ground leakage alarm equipment for monitoring such rotor winding insulation faults. This equipment can take a variety of forms. One known system of this type includes brushes which are periodically brought into contact with the rotor shaft. The existence of a single ground fault is detected by imposing a low voltage signal on the winding and the rotor. The existence of a ground fault creates a closed current loop which can be detected.

In another type of system for this purpose, a voltage monitoring unit is coupled to the ends of the rotor winding via slip rings and is operated to provide indications of the voltages between ground and each end of the winding. An arrangement of this type is disclosed, for example, in U.S. Pat. No. 4,812,751.

In various other known systems, test voltages are applied periodically to a machine winding, such as disclosed in U.S. Pat. Nos. 3,887,867, 4,187,525 and 4,556,946.

In all of the above-described systems, with the exception of those which employ a magnet coupling, the monitoring system is connected to the rotor winding by brushes or slip rings which are themselves subject to wear, and are hence not highly reliable. Moreover, all of the known systems are relatively expensive and complex.

SUMMARY OF THE INVENTION

It is a primary object of the present invention to monitor rotor winding ground faults in a manner which avoids the above-described shortcomings of the prior art.

Another object of the invention is to perform such a monitoring operation with an essentially passive system which does not require any electrical connections between moving parts.

A further object of the invention is to provide indications of the approximate location of a ground fault along the length of a rotor winding.

The above and other objects are achieved, according to the present invention, by a device for detecting a ground fault in a winding mounted to rotate with the rotor of a machine, in which an electric potential is present across the winding during machine operation, the rotor is grounded and the winding is normally insulated from ground, the device including: a current responsive light emitting element mounted to rotate with the rotor and electrically connected between the winding and the rotor; and a light responsive detector fixed in a position relative to the machine and having a field of view which is traversed by the light emitting element during a portion of each revolution of the rotor.

DESCRIPTION OF THE PREFERRED EMBODIMENTS

Figure 1:
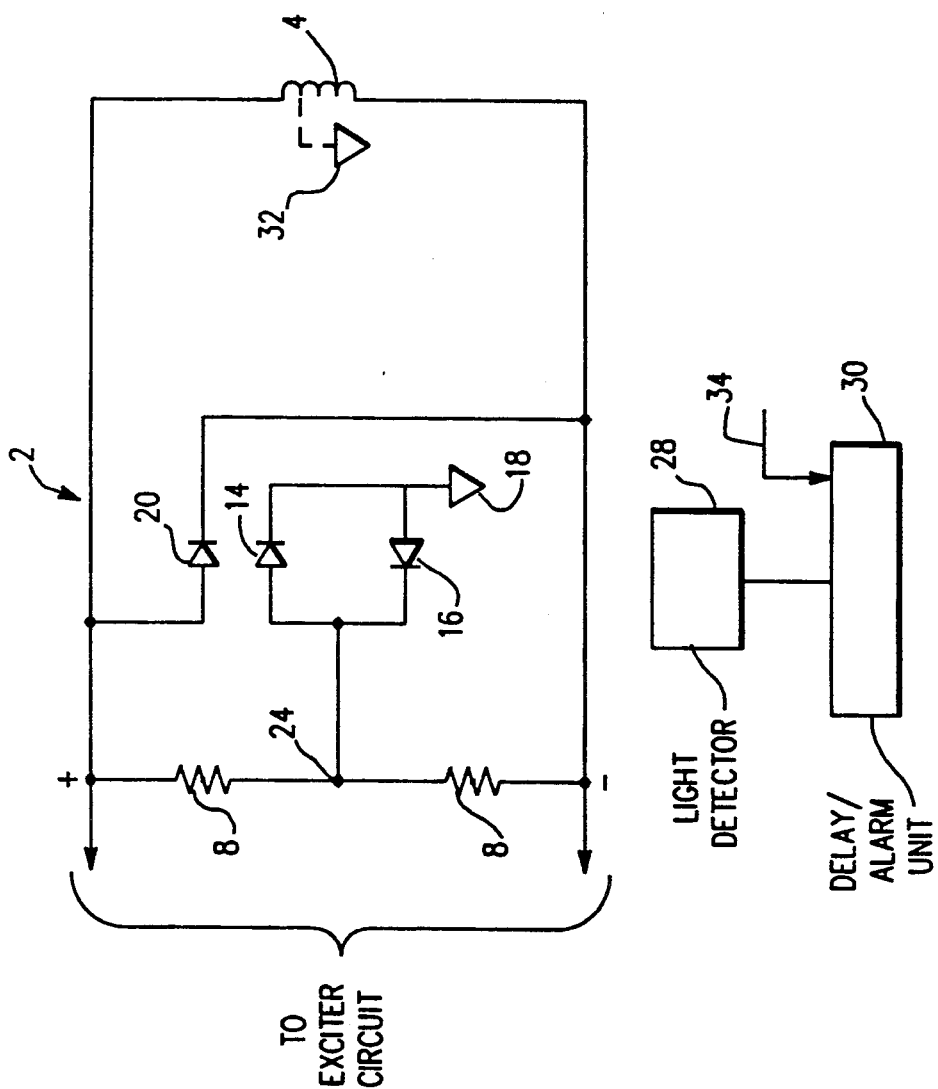
FIG. 1 is a circuit diagram of a preferred embodiment of a detection device according to the present invention.

FIG. 1 shows the portion of a rotating machine which includes a rotor 2 carrying a rotor winding 4, winding 4 being normally isolated from the rotor body and from ground by suitable insulation. The ends of rotor winding 4 are connected to an exciter circuit (not shown) which supplies a DC voltage across winding 4.

The detection device according to the present invention includes two high impedance resistors 8 connected in series between the ends of winding 4 and two light emitting diodes 14 and 16 connected between the series arrangement of resistors 8 and rotor ground 18, possibly associated with a series load resistor (not shown). In the illustrated embodiment, a further LED 20 is connected in parallel with rotor winding 4, and LED's 14, 16 are connected in polarity opposition between a first point 24 between resistors 8 and rotor ground 18.

LED's 14, 16 and 20 are all mounted on rotor 2 so as to be angularly space by selected distances from one another and so as to be observable from a region surrounding rotor 2.

The detection device according to the invention further includes a light detector 28 disposed to observe, and respond to, light being emitted by one or more of the LED's as rotor 2 rotates. Detector 28 produces an output signal in response to the light which it observes, and this signal is supplied to a display and/or alarm unit 30.

The structure described thus far operates as follows. As long as winding 4 is isolated from ground, the potential at the point of connection between resistors 8 will be floating and substantially no current can flow through either one of LEDs 14 and 16. If a single ground fault should develop between winding 4 and rotor ground 10, as shown for example in broken lines at 32, a current loop will be established and current will flow through one or the other of LEDs 14 and 16. The direction and magnitude of current flow between connection point 24 and rotor ground 18 will depend on the location of ground fault 32 along the length of winding 4. If ground fault 32 is between the center of winding 4 and its positive terminal, current will flow through diode 16; if ground fault 32 is located between the center of winding 4 and its negative terminal, current will flow through diode 14. The magnitude of the current will be proportional to the distance between the center of winding 4 and ground fault 32.

LED 20, because of the manner in which it is connected, will produce a continuous light output. LEDs 20, 14 and 16 are spaced from one another, about the circumference of rotor 2, by selected distances so that selected time intervals will elapse between the passage of successive LEDs past the field of view of detector 28. During each revolution of rotor 2, light detector 28 detects the light output of LED 20 and delivers an output pulse to unit 30. If LED 14 is also emitting light, detector 28 will produce a second output pulse which is spaced from the first pulse by a first selected time interval. If light is being emitted by LED 16, detector 28 will produce an output pulse which is spaced from the first pulse, produced by LED 20, by a second time interval.

In order to determine whether a second output pulse from detector 28 is associated with light emitted from LED 14 or LED 16, unit 30 further receives a timing signal 34 representative of the rate of rotation of rotor 2 and produced by a conventional rotation monitoring device. Typical devices of this type produce one output pulse per revolution, so that the time between pulses can serve to produce an indication of the rotor speed. Information relating to the rotor speed can, in turn, be used to provide signals representative of the abovementioned first and second time intervals which correspond, respectively, to the angular spacing between LED 20 and each of LEDs 14 and 16. By way of example, the once-per-revolution timing signal 34 can be supplied to a frequency multiplier which produces a plurality of regularly spaced pulses during each revolution of rotor 2. These pulses can then be supplied to a counter which is turned on by a first output pulse from detector 28 and produces a first timing pulse at the end of the first time interval and a second timing pulse at the end of the second timing interval.

Figure 2:
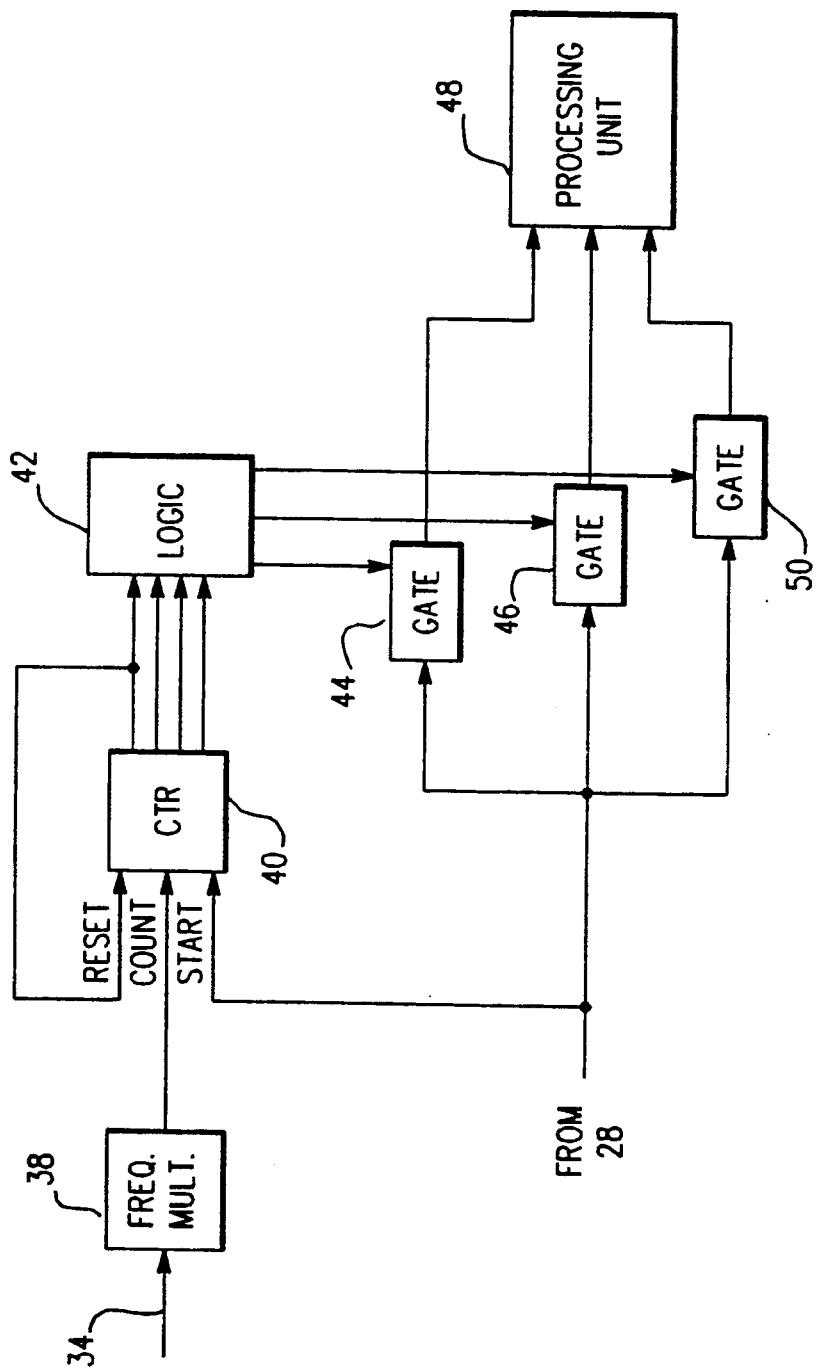
FIG. 2 is a block diagram of a display/alarm unit for the system of FIG. 1.

One embodiment of such an arrangement is illustrated in block form in FIG. 2 where timing signal 34 is delivered to a frequency multiplier 38 which produces a train of output pulses at a frequency which is a selected multiple of the pulse rate of timing signal 34. The output signal from frequency multiplier 38 is delivered to the count input of a counter 40. The count outputs from counter 40 are supplied to a logic module 42 having two outputs, each of which provides a gating signal when counter 40 has reached a selected count state, or range of count states. Each of these signals is supplied to the gating input of a respective gate 44, 46. The output signal from detector 28 is supplied to a signal input of each of gates 44 and 46, as well as to a start input of counter 40. Finally, a selected output of counter 40 is connected to a reset input thereof to reset the counter to its starting state. The connection to the reset input of counter 40 is such that the counter will be reset before the end of one revolution of rotor 2, but after passage of all LED's through the field of view of detector 28.

Subsequent to a resetting of counter 40, the next output pulse from detector 28 will result from detection of the light being emitted by LED 20. This pulse starts counter 40 so that a gating signal will be supplied to gate 44 during the interval when LED 14 is in the field of view of detector 28 and a gating signal is applied to gate 46 during the interval when LED 16 is in the field of view of detector 28. Any output pulse produced by detector 28 during either gating interval will be supplied to a respective input of a signal processing unit 48 and will result in a display and/or an alarm signal. At some time after the end of the second gating interval, the output signal from counter 40 will act to reset the counter. Even though detector output signals resulting from light produced by one or the other of LEDs 14 and 16 will reach the start input of counter 40, this will not have any influence on the operation of the counter.

In further accordance with the invention, the intensity of a light signal produced by either one of LEDs 14 and 16 is compared with that of the light produced by LED 20 in order to provide at least an approximate indication of the location of ground fault 32. Any fluctuation in the intensity of the light output from LED 14 or 16 due to soiling of the LEDs or variations in the winding voltage will influence the output from LED 20 in a corresponding manner, so that the relation between the illumination intensities will remain constant. The intensity of the light produced by either LED 14 or 16 will vary directly with the distance of a single fault 32 from the center of winding 4.

In the circuit shown in FIG. 2, the output of detector 28 is additionally supplied to a third gate 50 which receives, from logic module 42, a gating signal which can be initiated when counter 40 is reset and terminated shortly after the start of a counting operation, prior to initiation of the gating signal for gate 44. Processing unit 48 can be provided, in a conventional manner, with suitable signal amplitude comparison units to produce an indication of the relation between the intensity of illumination produced by either one of LEDs 14 and 16 and the illumination produced by LED 20.

According to an alternative embodiment of the invention, resistors 8 may be replaced by capacitors via which the comparatively lower ripple voltage induced in rotor winding 4 can be applied to illuminate a LED upon the occurrence of a ground fault.

According to another alternative embodiment of the invention, a voltage-to-frequency converter can be connected between connection point 24 and LEDs 14 and 16 to produce a flashing light whose frequency is proportional to the distance of ground fault 32, along the length of winding 4, from the center of winding 4.

While the description above relates to particular embodiments of the present invention, it will be understood that many modifications may be made without departing from the spirit thereof. The pending claims are intended to cover such modifications as would fall within the scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A device for detecting a ground fault in a winding mounted to rotate with the rotor of a machine, in which an electric potential is present across the winding during machine operation, the rotor is grounded and the winding is normally insulated from ground, said device comprising:

current responsive light emitting means mounted to rotate with said rotor;

electrical connection means mounted to rotate with said rotor and electrically connecting said light emitting means between said winding and said rotor; and light responsive detector means fixed in a position relative to said machine and having a field of view which is traversed by said light emitting means during a portion of each revolution of said rotor.

2. A device as defined in claim 1 wherein said electrical connection means comprise a voltage divider connected in parallel with said winding and having a tap, and a rotor ground connection, and said light emitting means are connected between said tap and said ground connection.

3. A device as defined in claim 2 wherein said light emitting means comprise two LEDs connected together in parallel polarity opposition.

4. A device as defined in claim 3 further comprising an additional light emitting device mounted to rotate with said rotor, connected to emit light continuously, and disposed to traverse the field of view of said detector means, said additional light emitting device being offset from said light emitting means about the axis of said rotor.

5. A device as defined in claim 4 further comprising signalling means connected to said detector means for producing a ground fault signal when said light emitting means emit light in the field of view of said detector means.

6. A device as defined in claim 1 wherein said light emitting means comprise two LEDs connected together in parallel polarity opposition.

7. A device as defined in claim further comprising an additional light emitting device mounted to rotate with said rotor, connected to emit light continuously, and disposed to traverse the field of view of said detector means, said additional light emitting device being offset from said light emitting means about the axis of said rotor.

8. A device as defined in claim 1 further comprising signalling means connected to said detector means for producing a ground fault signal when said light emitting means emit light in the field of view of said detector means.

9. A device as defined in claim 1 wherein said electrical connection means form, with said light emitting means, a current flow path for conducting ground fault currents between said winding and said rotor.

10. A device as defined in claim 3 wherein said two LEDs are offset from one another about the axis of said rotor.

11. A device as defined in claim 4 wherein said two LEDs are offset from one another about the axis of said rotor.

12. A device as defined in claim 6 wherein said two LEDs are offset from one another about the axis of said rotor.

* * * * *